United States Patent
Brandenburg et al.

(10) Patent No.: US 7,230,832 B2
(45) Date of Patent: Jun. 12, 2007

(54) COOLED ELECTRONIC ASSEMBLY AND METHOD FOR COOLING A PRINTED CIRCUIT BOARD

(75) Inventors: Scott D. Brandenburg, Kokomo, IN (US); Suresh K. Chengalva, Kokomo, IN (US)

(73) Assignee: Delphi Technologies, Inc., Troy, MI (US)

( * ) Notice: Subject to any disclaimer, the term of this patent is extended or adjusted under 35 U.S.C. 154(b) by 189 days.

(21) Appl. No.: 11/155,371

(22) Filed: Jun. 17, 2005

(65) Prior Publication Data

US 2006/0285300 A1 Dec. 21, 2006

(51) Int. Cl.
*H05K 7/20* (2006.01)
*F16L 39/00* (2006.01)

(52) U.S. Cl. .............. 361/720; 361/698; 361/699; 361/719; 257/714; 165/80.4

(58) Field of Classification Search ........... 361/688, 361/689, 699–704, 707–715, 719–721, 761–764; 165/80.2–80.4; 174/15.1, 16.1, 16.3; 257/707–713, 257/714, 715, 787, 796; 62/3.2, 3.7; 438/106, 438/118, 124–127; 285/125.1; 428/138; 29/890.03
See application file for complete search history.

(56) References Cited

U.S. PATENT DOCUMENTS

| | | | |
|---|---|---|---|
| 5,241,450 A | | 8/1993 | Bernhardt et al. |
| 5,801,442 A | * | 9/1998 | Hamilton et al. ........... 257/714 |
| 6,413,801 B1 | * | 7/2002 | Lin ........................... 438/127 |
| 6,490,159 B1 | * | 12/2002 | Goenka et al. ............. 361/700 |
| 6,529,377 B1 | * | 3/2003 | Nelson et al. .............. 361/699 |
| 6,591,625 B1 | * | 7/2003 | Simon ....................... 62/259.2 |
| 6,785,134 B2 | * | 8/2004 | Maveety et al. ........... 361/699 |
| 6,976,527 B2 | * | 12/2005 | Kirshberg et al. ..... 165/104.33 |
| 7,029,951 B2 | * | 4/2006 | Chen et al. ................. 438/122 |
| 2004/0190251 A1 | | 9/2004 | Prasher et al. |
| 2005/0151371 A1 | * | 7/2005 | Simmons et al. ........ 285/125.1 |

OTHER PUBLICATIONS

EP Search Report Dated Jul. 12, 2006.
Flip Chips Kulicke & Soffa Practical Dummy Components http://www.practicalcomponents.com/flipchip.htm.

* cited by examiner

*Primary Examiner*—Michael Datskovskiy
(74) *Attorney, Agent, or Firm*—Jimmy L. Funke

(57) ABSTRACT

A cooled electronic assembly includes an integrated-circuit device carrier (such as a printed circuit board), a device (such as a flip chip), a liquid pump, a molding material, a heat exchanger, and a cover. The device and the liquid pump are electrically connected to the integrated-circuit device carrier. The molding material is molded to the device, to the liquid pump, and to the integrated-circuit device carrier. The cover has a coolant channel fluidly connected to the heat exchanger, wherein the cover is attached to the molding material. The coolant channel and the heat exchanger together at least partially define a closed coolant circuit. The liquid pump is operatively connected to the closed coolant circuit. A method for cooling a printed circuit board includes placing a liquid coolant in the closed coolant circuit and electrically activating the liquid pump through the printed circuit board.

20 Claims, 3 Drawing Sheets

COOLED ELECTRONIC ASSEMBLY AND METHOD FOR COOLING A PRINTED CIRCUIT BOARD

TECHNICAL FIELD

The present invention relates generally to electronic assemblies, and more particularly to a cooled electronic assembly and to a method for cooling a printed circuit board.

BACKGROUND OF THE INVENTION

Conventional electronic-assembly liquid cooling methods include using a first heat exchanger to remove heat energy from the electronic assembly, a second heat exchanger to transfer to the environment the removed heat received from the first heat exchanger, plumbing to connect the two heat exchangers into a re-circulating liquid cooling system, and a pump to force a liquid coolant through the cooling system. The fabrication of these components and their assembly into a cooling system can be relatively complicated and costly. Such a cooling system can pose reliability problems in maintaining liquid-tight interfaces between adjacent components during the life of the product.

What is needed is an improved cooled electronic assembly and an improved method for cooling a printed circuit board.

SUMMARY OF THE INVENTION

A first expression of an embodiment of the invention is for a cooled electronic assembly which includes a printed circuit board, a flip chip, a liquid pump, a molding material, a heat exchanger, and a cover. The flip chip is electrically connected to the printed circuit board and includes a first coolant channel. The liquid pump is electrically connected to the printed circuit board. The molding material is molded to the flip chip, to the liquid pump, and to the printed circuit board. The cover has a second coolant channel fluidly connected to the heat exchanger, wherein the cover is attached to the molding material. The first coolant channel, the heat exchanger, and the second coolant channel together at least partially define a closed coolant circuit. The liquid pump is operatively connected to the closed coolant circuit.

A method of the invention is for cooling a printed circuit board and includes several steps. One step includes electrically connecting a flip chip to the printed circuit board, wherein the flip chip includes a first coolant channel. Another step includes electrically connecting a liquid pump to the printed circuit board. Another step includes molding a molding material to the flip chip, to the liquid pump, and to the printed circuit board. Another step includes attaching a cover to the molding material, wherein the cover has a second coolant channel fluidly connected to a heat exchanger, wherein the first coolant channel, the heat exchanger, and the second coolant channel together at least partially define a closed coolant circuit, and wherein the liquid pump is operatively connected to the closed coolant circuit. Another step includes placing a liquid coolant in the closed coolant circuit. Another step includes electrically activating the liquid pump through the printed circuit board.

A second expression of an embodiment of the invention is for a cooled electronic assembly which includes an integrated-circuit device carrier, a device, a liquid pump, a molding material, a heat exchanger, and a cover. The device is electrically connected to the integrated-circuit device carrier. The liquid pump is electrically connected to the integrated-circuit device carrier. The molding material is molded to the device, to the liquid pump, and to the integrated-circuit device carrier. The cover has a coolant channel fluidly connected to the heat exchanger, wherein the cover is attached to the molding material. The coolant channel and the heat exchanger together at least partially define a closed coolant circuit. The liquid pump is operatively connected to the closed coolant circuit.

Several benefits and advantages are derived from one or more of the expressions of the embodiment and the method of the invention. In one example, adhesively bonding a cover having a coolant channel to molding material, which has been molded to a printed circuit board and to a flip chip and a liquid pump each electrically connected to the printed circuit board, results in a cooled electronic assembly which is less costly and less complicated to assemble. In the same or a different example, such a cooled electronic assembly provides more reliable liquid-tight interfaces than is achieved using conventional liquid cooling systems.

DETAILED DESCRIPTION

Figure 1:
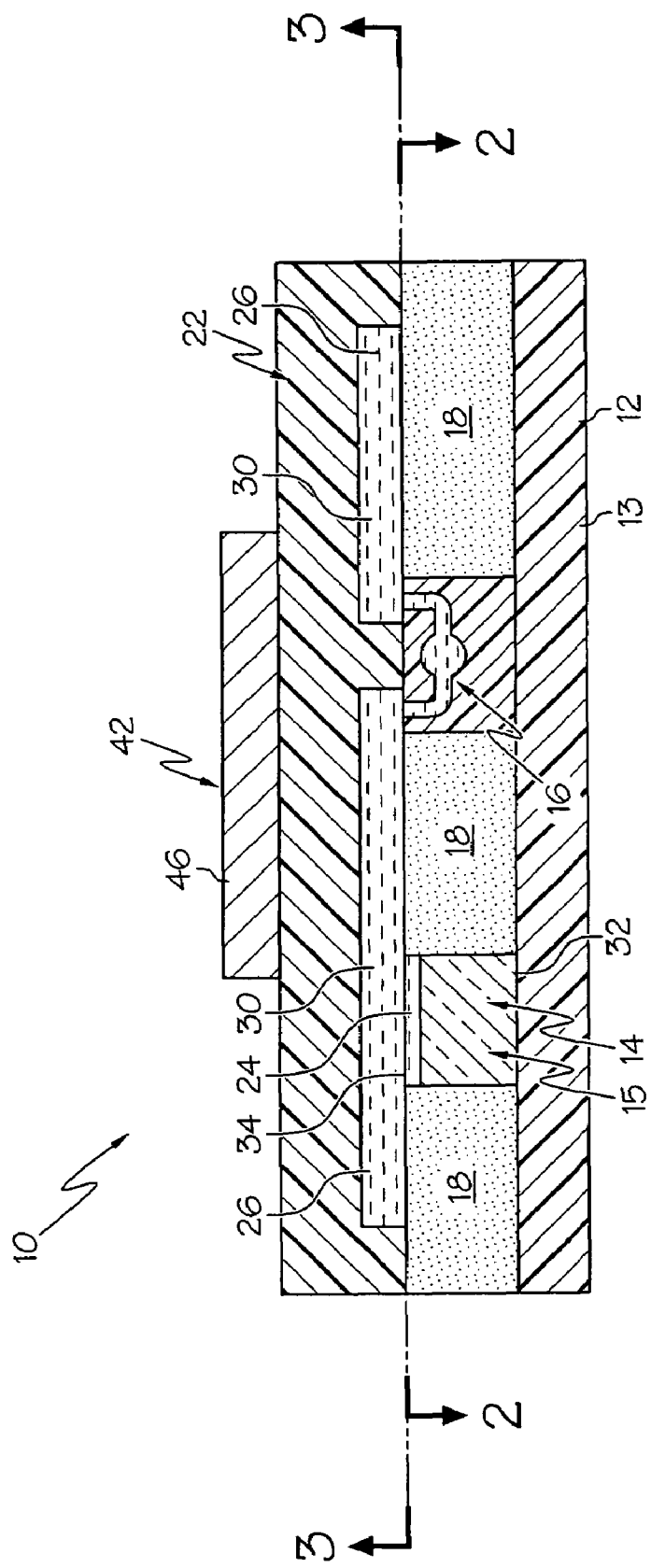
FIG. 1 is a schematic, cross sectional view of a first embodiment of a cooled electronic assembly which includes a first embodiment of a flip chip.
Figure 3:
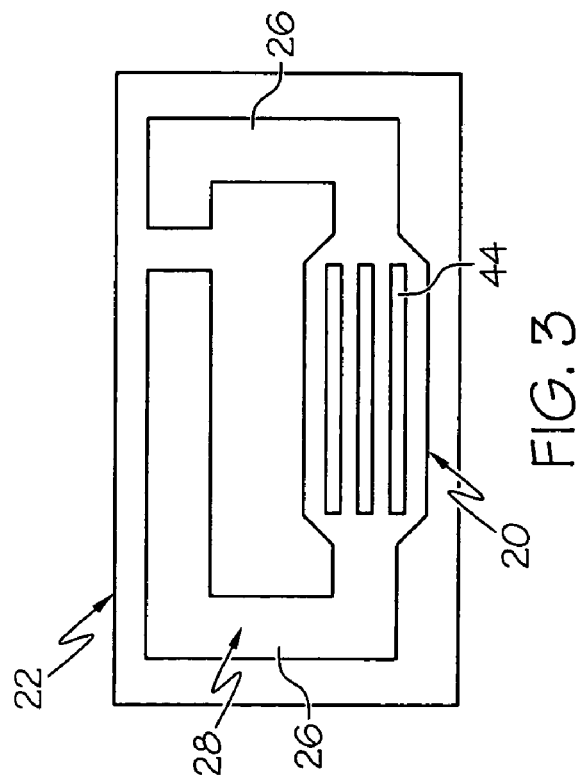
FIG. 3 is a view taken along lines 3—3 in FIG. 1.
Figure 2:
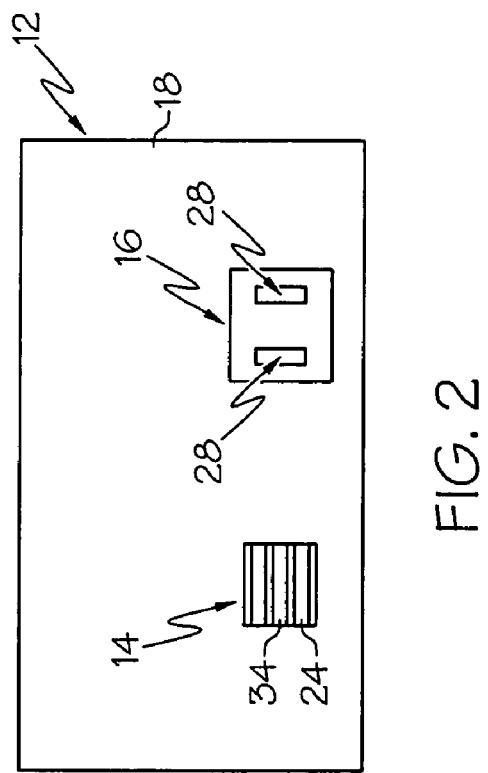
FIG. 2 is a view taken along lines 2—2 in FIG. 1.

A first embodiment of the invention is shown in FIGS. 1–3. A first expression of the embodiment of FIGS. 1–3 is for a cooled electronic assembly 10 which includes a printed circuit board 12, a flip chip 14, a liquid pump 16, a molding material 18, a heat exchanger 20, and a cover 22. The flip chip 14 is electrically connected to the printed circuit board 12 and includes a first coolant channel 24. The liquid pump 16 is electrically connected to the printed circuit board 12. The molding material 18 is molded to the flip chip 14, to the liquid pump 16, and to the printed circuit board 12. The cover 22 has a second coolant channel 26 fluidly connected to the heat exchanger 20, wherein the cover 22 is attached to the molding material 18. The first coolant channel 24, the heat exchanger 20, and the second coolant channel 26 together at least partially define a closed coolant circuit 28. The liquid pump 16 is operatively connected to the closed coolant circuit 28.

In one enablement of the embodiment of FIGS. 1–3, the first coolant channel 24 of the flip chip 14 is exposed to the second coolant channel 26 of the cover 22. By "exposed" is meant that the first coolant channel 24 is exposed to the second coolant channel 26 transversely across the flow of a liquid coolant 30 in the closed coolant circuit 28. In this enablement, heat is transferred directly from the second side 34 of the flip chip 14 to the liquid coolant 30. In a different enablement, the first coolant channel is internal to the flip chip 14, and/or the second coolant channel is internal to the cover 22. In one variation of any enablement, the closed coolant circuit 28 does not extend outside an assemblage defined by the cover 22, the molding material 18, and the printed circuit board 12. In one example, the cooled electronic assembly 10 is thus provided with a totally enclosed re-circulating liquid cooling system.

In one configuration of the embodiment of FIGS. 1–3, the flip chip 14 has a first side 32 facing toward the printed circuit board 12 and has a second side 34 facing away from the printed circuit board 12. In a first variation, the second side 34 is electrically inactive. In one example of the first variation, the flip chip 14 is said to be electrically lateral having all of its electrical connections to the printed circuit board 12 from the first side 32 of the flip chip 14. In a second variation, shown in the embodiment of FIG. 4, the cooled electronic assembly 110 also includes a lead 36 (such as a copper lead) extending alongside the flip chip 114 from the second side 134 to the first side 132. In one example of the second variation, the second side 134 includes an electrically active location 38, wherein the cover 122 includes a conductive portion 40 (such as a copper inlay molded into the cover 22), and wherein an electric path is defined from the printed circuit board 112 through the flip chip 114 to the electrically active location 38 of the second side 134 to the conductive portion 40 of the cover 122 to the lead 36 and back to the printed circuit board 112. In one modification, a solder or a conductive adhesive attaches the conductive portion 40 of the cover 122 to the lead 36.

In one implementation of the embodiment of FIGS. 1–3, the molding material 18 is disposed (such as via a pillow top molding technique) substantially flush with the second side 34 of the flip chip 14 and completely surrounds the flip chip 14 between the first and second sides 32 and 34. In one variation, the second side 34 of the flip chip 14 is in direct contact with the liquid coolant 30. In a different implementation, not shown, the molding material covers the second side of the flip chip, and heat is transferred from the second side through the overlying molding material to the liquid coolant. Other implementations are left to the artisan.

In one arrangement of the embodiment of FIGS. 1–3, the cover 22 is a molded cover which retains the heat exchanger 20. In one variation, the heat exchanger 20 includes metal fins 42 having an inner portion 44 protruding into the second coolant channel 26 of the cover 22 in direct contact with the liquid coolant 30 and having an outer portion 46 extending outside the cover 22 in contact with the atmosphere. In a different variation, not shown, the heat exchanger includes a heat pipe which provides external passive cooling of the liquid coolant. In another variation, not shown, the heat exchanger includes a pipe carrying a heat-absorbing liquid or gas which provides external active cooling of the liquid coolant. In a different arrangement, not shown, the heat exchanger is disposed outside and remote to the cover and the printed circuit board.

In one construction of the embodiment of FIGS. 1–3, the cover 22 is adhesively bonded to the molding material 18 making a liquid-tight attachment to the molding material 18. In one variation, the molding material 18 consists essentially of epoxy. In one modification, the cover 22 is a plastic cover. In a different modification, the cover is a metal cover. In the same or a different construction, the first coolant channel 24 is a surface micro groove, the second coolant channel 26 is a surface macro groove disposed to face the surface micro groove, and the cooled electronic assembly 10 also includes a liquid coolant 30 disposed in the closed coolant circuit 28 and contacting the surface macro groove and the surface micro groove. In the same or a different construction, the liquid pump 16 is a micro liquid pump.

In one employment of the embodiment of FIGS. 1–3, the second side 34 of the flip chip 14 is electrically inactive, and the liquid coolant 30 is an electrically conductive or an electrically non-conductive liquid coolant. In a different employment of the embodiment of FIG. 4, the second side 134 of the flip chip 114 is electrically active, and the liquid coolant 130 is an electrically non-conductive liquid coolant. Examples of electrically conductive liquid coolants and electrically non-conductive liquid coolants are well known to those skilled in the art.

A method of the invention is for cooling a printed circuit board 12 and includes steps a) through f). Step a) includes electrically connecting a flip chip 14 to the printed circuit board 12, wherein the flip chip 14 includes a first coolant channel 24. Step b) includes electrically connecting a liquid pump 16 to the printed circuit board 12. Step c) includes molding a molding material 18 to the flip chip 14, to the liquid pump 16, and to the printed circuit board 12. Step d) includes attaching a cover 22 to the molding material 18, wherein the cover 22 has a second coolant channel 26 fluidly connected to a heat exchanger 20, wherein the first coolant channel 24, the heat exchanger 20, and the second coolant channel 26 together at least partially define a closed coolant circuit 28, and wherein the liquid pump 16 is operatively connected to the closed coolant circuit 28. Step e) includes disposing a liquid coolant 30 in the closed coolant circuit 28. Step f) includes electrically activating the liquid pump 16 through the printed circuit board 12.

In one employment of the method, the flip chip 14 has a first side 32 facing toward the printed circuit board 12 and has a second side 34 facing away from the printed circuit board 12, and step c) includes disposing the molding material 18 substantially flush with the second side 34 of the flip chip 14. In the same or a different employment, step e) includes introducing the liquid coolant 30 into the closed coolant circuit 28 from an access port (not shown) on the outside of the top of the cover 22 and then plugging the access port.

A second expression of the embodiment of FIGS. 1–3 is for a cooled electronic assembly 10 which includes an integrated-circuit device carrier 13, a device 15, a liquid pump 16, a molding material 18, a heat exchanger 20, and a cover 22. The device 15 is electrically connected to the integrated-circuit device carrier 13. The liquid pump 16 is electrically connected to the integrated-circuit device carrier 13. The molding material 18 is molded to the device 15, to the liquid pump 16, and to the integrated-circuit device carrier 13. The cover 22 has a coolant channel 26 fluidly connected to the heat exchanger 20, wherein the cover 22 is attached to the molding material 18. The first coolant channel 24, the heat exchanger 20, and the second coolant channel 26 together at least partially define a closed coolant circuit 28. The liquid pump 16 is operatively connected to the closed coolant circuit 28.

Figure 4:
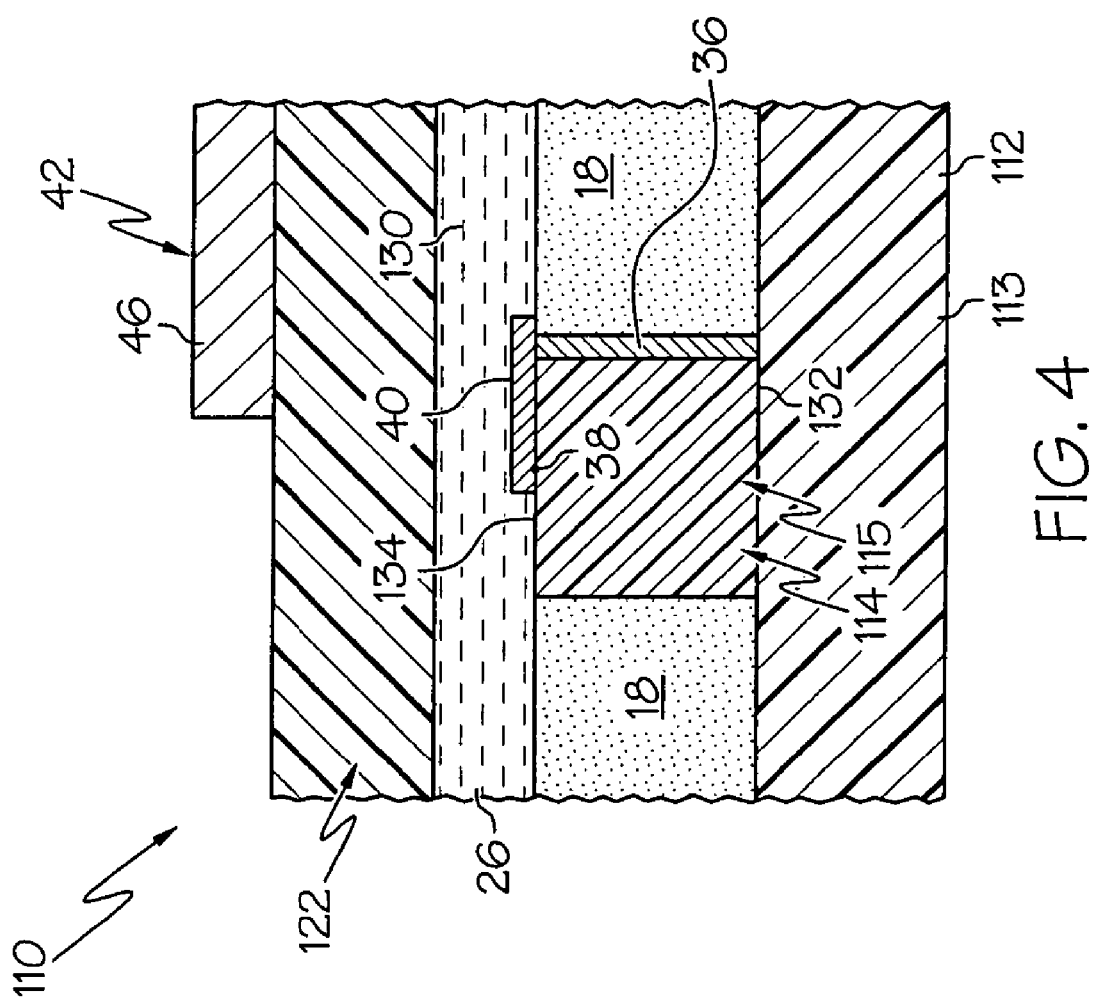
FIG. 4 is a schematic, cross sectional, partial view of a second embodiment of a cooled electronic assembly, similar to that in FIG. 1, but with a second embodiment of a flip chip.

The previously-described enablements, implementations, arrangements, etc. of the first expression of the embodiment of FIGS. 1–3, are equally applicable to the second expression of the embodiment of FIGS. 1–3 with "integrated-circuit device carrier 13" replacing "printed circuit board 12", with "device 15" replacing "flip chip 14", and with "coolant channel 26" replacing "second coolant channel 26", as can be appreciated by those skilled in the art. Likewise, the previously-described variation, shown in the embodiment of FIG. 4, is equally applicable with "integrated-circuit device carrier 113" replacing "printed circuit board 12" and "device 115" replacing "flip chip 114". In one application, the integrated-circuit device carrier 13 and 113 is a printed circuit board, a ceramic or a lead frame. In one variation, the molding material and the integrated-circuit device carrier create an overmolded integrated-circuit device carrier with exposed backside silicon (FICO Exposed Die Molding Process).

Several benefits and advantages are derived from one or more of the expressions of the embodiment and the method of the invention. In one example, adhesively bonding a cover having a coolant channel to molding material, which has been molded to a printed circuit board and to a flip chip and a liquid pump each electrically connected to the printed circuit board, results in a cooled electronic assembly which is less costly and less complicated to assemble. In the same or a different example, such a cooled electronic assembly provides more reliable liquid-tight interfaces than is achieved using conventional liquid cooling systems.

The foregoing description of several embodiments and a method of the invention has been presented for purposes of illustration. It is not intended to be exhaustive or to limit the invention to the precise procedures or precise forms disclosed, and obviously many modifications and variations are possible in light of the above teaching. It is intended that the scope of the invention be defined by the claims appended hereto.

The invention claimed is:

1. A cooled electronic assembly comprising:
    a) a printed circuit board;
    b) a flip chip electrically connected to the printed circuit board and including a first coolant channel;
    c) a liquid pump electrically connected to the printed circuit board;
    d) a molding material molded to the flip chip, to the liquid pump, and to the printed circuit board;
    e) a heat exchanger; and
    f) a cover having a second coolant channel fluidly connected to the heat exchanger, wherein the cover is attached to the molding material, wherein the first coolant channel, the heat exchanger, and the second coolant channel together at least partially define a closed coolant circuit, and wherein the liquid pump is operatively connected to the closed coolant circuit.

2. The cooled electronic assembly of claim 1, wherein the first coolant channel of the flip chip is exposed to the second coolant channel of the cover.

3. The cooled electronic assembly of claim 2, wherein the flip chip has a first side facing toward the printed circuit board and has a second side facing away from the printed circuit board.

4. The cooled electronic assembly of claim 3, wherein the second side is electrically inactive.

5. The cooled electronic assembly of claim 3, also including a lead extending alongside the flip chip from the second side to the first side, wherein the second side includes an electrically active location, wherein the cover includes a conductive portion, and wherein an electric path is defined from the printed circuit board through the flip chip to the electrically active location of the second side to the conductive portion of the cover to the lead and back to the printed circuit board.

6. The cooled electronic assembly of claim 3, wherein the molding material is disposed substantially flush with the second side of the flip chip.

7. The cooled electronic assembly of claim 1, wherein the cover is a molded cover which retains the heat exchanger.

8. The cooled electronic assembly of claim 1, wherein the cover is adhesively bonded to the molding material.

9. The cooled electronic assembly of claim 1, wherein the first coolant channel is a surface micro groove, wherein the second coolant channel is a surface macro groove disposed to face the surface micro groove, and also including a liquid coolant disposed in the closed coolant circuit and contacting the surface macro groove and the surface micro groove.

10. A method for cooling a printed circuit board comprising the steps of:
    a) electrically connecting a flip chip to the printed circuit board, wherein the flip chip includes a first coolant channel;
    b) electrically connecting a liquid pump to the printed circuit board;
    c) molding a molding material to the flip chip, to the liquid pump, and to the printed circuit board;
    d) attaching a cover to the molding material, wherein the cover has a second coolant channel fluidly connected to a heat exchanger, wherein the first coolant channel, the heat exchanger, and the second coolant channel together at least partially define a closed coolant circuit, and wherein the liquid pump is operatively connected to the closed coolant circuit;
    e) disposing a liquid coolant in the closed coolant circuit; and
    f) electrically activating the liquid pump through the printed circuit board.

11. The method of claim 10, wherein the flip chip has a first side facing toward the printed circuit board and has a second side facing away from the printed circuit board, and wherein step c) includes disposing the molding material substantially flush with the second side of the flip chip.

12. A cooled electronic assembly comprising:
    a) an integrated-circuit device carrier;
    b) a device electrically connected to the integrated-circuit device carrier;
    c) a liquid pump electrically connected to the integrated-circuit device carrier;
    d) a molding material molded to the device, to the liquid pump, and to the integrated-circuit device carrier;
    e) a heat exchanger; and
    f) a cover having a coolant channel fluidly connected to the heat exchanger, wherein the cover is attached to the molding material, wherein the heat exchanger and the coolant channel together at least partially define a closed coolant circuit, and wherein the liquid pump is operatively connected to the closed coolant circuit.

13. The cooled electronic assembly of claim 12 wherein the device is exposed to the coolant channel.

14. The cooled electronic assembly of claim 13, wherein the device has a first side facing toward the integrated-circuit device carrier and has a second side facing away from the integrated-circuit device carrier.

15. The cooled electronic assembly of claim 14, wherein the second side is electrically inactive.

16. The cooled electronic assembly of claim 14, also including a lead extending alongside the device from the second side to the first side, wherein the second side includes an electrically active location, wherein the cover includes a conductive portion, and wherein an electric path is defined from the integrated-circuit device carrier through the device to the electrically active location of the second side to the conductive portion of the cover to the lead and back to the integrated-circuit device carrier.

17. The cooled electronic assembly of claim 14, wherein the molding material is disposed substantially flush with the second side of the device.

18. The cooled electronic assembly of claim 12, wherein the cover is a molded cover which retains the heat exchanger.

19. The cooled electronic assembly of claim 12, wherein the cover is adhesively bonded to the molding material.

20. The cooled electronic assembly of claim 12, wherein the device includes a surface micro groove, wherein the coolant channel is a surface macro groove disposed to face the surface micro groove, and also including a liquid coolant disposed in the closed coolant circuit and contacting the surface macro groove and the surface micro groove.

* * * * *